United States Patent [19]

Anantha et al.

[11] 4,269,631
[45] May 26, 1981

[54] SELECTIVE EPITAXY METHOD USING LASER ANNEALING FOR MAKING FILAMENTARY TRANSISTORS

[75] Inventors: Narasipur G. Anantha, Hopewell Junction; Gurumakonda R. Srinivasan, Poughkeepsie, both of N.Y.

[73] Assignee: International Business Machines Corporation, Armonk, N.Y.

[21] Appl. No.: 111,570

[22] Filed: Jan. 14, 1980

[51] Int. Cl.[3] .................... H01L 21/263; H01L 7/36
[52] U.S. Cl. ................................... 148/1.5; 148/187; 357/91; 427/53.1
[58] Field of Search ................... 148/1.5, 187; 357/91; 427/53.1

[56] References Cited

U.S. PATENT DOCUMENTS

| | | | |
|---|---|---|---|
| 3,585,088 | 6/1971 | Schwuttke | 148/174 |
| 3,796,613 | 3/1974 | Magdo et al. | 148/175 |
| 3,950,187 | 4/1976 | Kirkpatrick | 148/1.5 |
| 4,059,461 | 11/1977 | Fan et al. | 148/1.5 |
| 4,059,707 | 11/1977 | Smith et al. | 427/35 |
| 4,187,126 | 2/1980 | Radd et al. | 148/1.5 |

OTHER PUBLICATIONS

Gat et al., Appl. Phys. Letts., 32 (1978) 277.
Von Allmen et al., Appl. Phys. Letts., 33 (1978) 824.
Foti et al., Electrochem. Soc. Meeting, Abstract #168, Oct. 1977, pp. 459–460.
Volfson et al., Sov. Phys. Semicond., 1 (1967) 327.
Auston, D. H., Bell Lab. Records, Jul.-Aug. 1979, pp. 187–191.
Narayan et al., J. Appl. Phys., 49 (1978), 3912.
Fairfield et al., Solid St. Electronics, 11 (1968) 1175.
Lau et al., Appl. Phys., Letts., 33(2) (1978) 130.
Baeri et al., J. Appl. Phys., 50(2) (1979) 788.
Klimenko et al., Sov. J. Quant. Electron., 5 (1976) 1289.
Sealy, B. J., J. Crystal Growth, 48 (1979) 655.
Anantha et al., IBM-Tech. Disc. Bull. 22 (1979) 575.
Bean et al., J. Appl. Phys. 50(2) (1979) 881.
Foti et al., Appl. Phys., 15 (1978) 365.
Vitali et al., Phys. Letts., 63a (1977) 351.

*Primary Examiner*—R. Dean
*Assistant Examiner*—Upendra Roy
*Attorney, Agent, or Firm*—Robert J. Haase

[57] ABSTRACT

A method for making a filamentary pedestal transistor is disclosed in which epitaxial silicon is formed selectively above portions of a subcollector through the use of laser radiation. A single crystal substrate, having a subcollector of higher impurity concentration, is covered by an oxide mask which is apertured at two locations above the subcollector. Polycrystalline silicon is deposited over the apertured oxide mask. The structure is exposed to laser radiation of suitable energy level and wavelength to selectively convert the polycrystalline silicon to epitaxial monocrystalline silicon within and above the oxide apertures. The transistor is completed by conventional techniques to form base, emitter and collector reach-through regions.

11 Claims, 8 Drawing Figures

SELECTIVE EPITAXY METHOD USING LASER ANNEALING FOR MAKING FILAMENTARY TRANSISTORS

DESCRIPTION

BACKGROUND OF THE INVENTION

1. Field of the Invention

The invention generally relates to methods for making filamentary pedestal bipolar transistors and, more particularly, to a laser annealing method for selectively forming an epitaxial collector pedestal region for such transistors.

2. Description of the Prior Art

High performance bipolar transistors are known in which switching speed is greatly improved by the elimination of the extrinsic base-collector junction and the undesired capacitance associated with it. In the absence of base-collector capacitance domination, speed-power characteristics at lower power can be further improved by the reduction of the extrinsic base resistance. Such resistance reduction has been achieved by the provision of a low resistance, contiguous polycrystalline silicon base contacting member.

The foregoing techniques are disclosed in U.S. Pat. No. 3,796,613, issued to I. E. Magdo et al on Mar. 12, 1974, for "Method of Forming Dielectric Isolation For High Density Pedestal Semiconductor Devices" and assigned to the present assignee.

It is further advantageous that all of the foregoing considerations be accomplished in a manner permitting narrowing of the intrinsic collector junction so as to maximize device performance and density in integrated circuit chips. According to the technique disclosed in the aforementioned patent, silicon is deposited through an oxide layer which is apertured over the intrinsic collector region. Epitaxial growth results only in the exposed, recessed collector region, as desired, provided that the oxide window delineating said region is at least a certain size so that "bridging" can not occur. Although, ideally, no silicon should deposit on the raised oxide surrounding the collector region aperture, there remains a tendency to do so unless critical silicon deposition conditions are maintained reliably. Any undesired polycrystalline silicon deposits on the surrounding oxide tend to "bridge" over the aperture, preventing desired deposition within the aperture, especially where the aperture is made small for high component density.

In copending patent application Ser. No. 080,648, filed in the names of Anantha et al on Oct. 1, 1979 for "Selective Epitaxy Method For Making Filamentary Pedestal Transistor" and assigned to the present assignee, a method is disclosed for making a filamentary pedestal transistor in which minimum base-collector capacitance is achieved along with reduced extrinsic base resistance for high performance in a manner compatible with reduced device area for high component density. The method comprises depositing silicon on a coplanar oxide-silicon surface in which only the top silicon surface of a buried collector pedestal is exposed through the oxide. Epitaxial silicon deposits only over the exposed pedestal surface while polycrystalline silicon deposits over the contiguous oxide surface. The simultaneous epitaxial and polycrystalline silicon deposition over a coplanar surface inhibits bridging of the exposed pedestal surface by the polycrystalline silicon and allows the polycrystalline silicon to be used advantageously as a low resistance base contact.

Although the tendency of the deposited silicon to bridge over the collector region is substantially reduced in the coplanar deposition method of the cited application, relative to the non-coplanar deposition method of the cited patent, there still is a tendency for the deposited silicon to remain undesirably polycrystalline over the collector region as the collector region continues to be narrowed in size in an effort to achieve even higher orders of device density.

SUMMARY OF THE INVENTION

A method for making a filamentary pedestal transistor is disclosed in which epitaxial single crystal is formed selectively over the subcollector region of a monocrystalline substrate independently of whether the subcollector region is coplanar or non-coplanar relative the structure adjacent to the subcollector region and over which the silicon initially is deposited. The method comprises providing a single crystal substrate of one conductivity type in which a subcollector of higher impurity concentration is formed. An oxide mask is placed over the substrate and is apertured at two locations above the subcollector. Polycrystalline silicon then is deposited over the apertured silicon oxide. The polycrystalline silicon within the oxide apertures is annealed by laser radiation of suitable wavelength and energy level to be absorbed selectively by the heavily doped subcollector region exposed through the oxide apertures. The annealing converts the polycrystalline silicon to single crystal epitaxial silicon within and above the oxide apertures. The transistor is completed by conventional techniques to form base, emitter and collector reach-through regions.

DESCRIPTION OF THE PREFERRED EMBODIMENT

Laser radiation interaction with doped silicon has been investigated for some time. Some experiments involving group III and V impurities of different concentrations are reported in the paper *Fundamental Absorption Edge of Silicon Heavily Doped With Donor Or Acceptor Impurities* by A. A. Volfson and V. K. Subashiev, Sovient Physics—Semiconductors, Vol. 1, No. 3, September 1967, p. 327. More recently, attention has been given to the use of laser energy for causing ion implanted amorphous silicon layers to be regrown epitaxially on a [100] single crystal substrate. This is discussed in the paper *Epitaxial Growth of Deposited Amorphous Layer by Laser Annealing* by S. S. Lau et al, Applied Physics Letters, 33(2), July 15, 1978, p. 130. The present invention exploits these phenomena, of the absorption of laser energy by doped silicon material and the epitaxial regrowth of amorphous silicon by laser annealing, to accomplish the selective epitaxial recrystallization of amorphous silicon deposited over apertured silicon dioxide to produce extremely narrow filamentary pedestal transistors.

Figure 1:
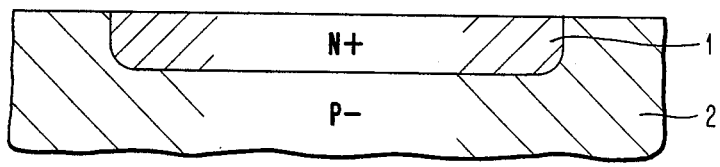
FIGS. 1-8 are sequential sectional views of a bipolar transistor at selected stages in the course of fabrication in accordance with the method of the present invention.

Referring to FIG. 1, N+ subcollector 1 is formed in P− substrate 2 in a conventional manner. It is preferred that subcollector 1 be doped to an impurity concentration in the range from about $1 \times 10^{20}$ to about $1.5 \times 10^{21}$ at/cc. Substrate 2 preferably is in the range from intrinsic value to about $1 \times 10^{15}$ at/cc.

Figure 2:
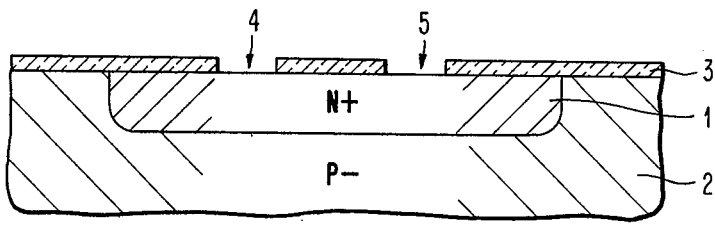

Oxide 3 is deposited, as shown in FIG. 2, over the structure of FIG. 1 and windows are opened in the oxide in the pedestal collector region 4 and in the collector reach-through region 5. Then, a layer of undoped polycrystalline silicon is deposited to a thickness in the range from about 0.1 to about 1 μm over the apertured oxide 3. Coarse grained polycrystalline silicon forms within regions 4 and 5. Suitable polycrystalline silicon 10 may be deposited using pure silane low pressure chemical vapor deposition at about 625° C. with a deposition rate of about 100 Å/min.

Figure 3:
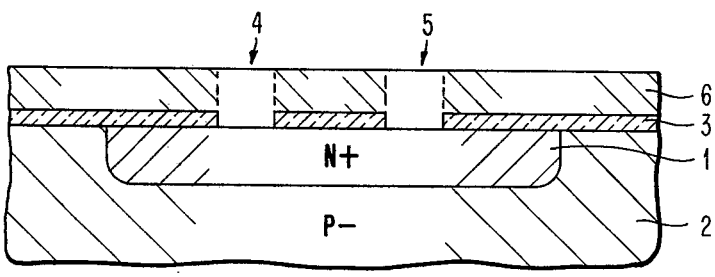

The resulting polycrystalline layer 6 is planarized as shown in FIG. 3 in a conventional manner. Briefly, a planar layer of photoresist (not shown) is spun over the surface of the deposited polycrystalline silicon layer which conforms to the surface contour of the underlying apertured oxide 3. The photoresist preferably is polyimide having an etching rate of about 400 Å/min when using $CF_4$ reactive ion etching which is substantially equal to the etching rate of polysilicon 6. Consequently, the surface of the structure remains planar as it is reactively ion etched away completely through the resist and then into the polysilicon layer 6. The etching is continued until polysilicon layer 6 becomes planar as depicted in FIG. 3.

Figure 4:
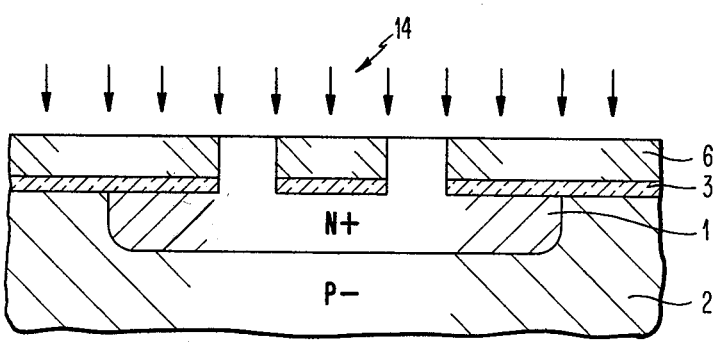

Radiation 14, preferably from a neodymium doped yttrium aluminum garnet laser operating at a wavelength of about 1.06 μm and within an energy range of about 1.5 to about 5 $J/cm^2$, is directed upon the structure of FIG. 4 and efficiently couples into the N+ subcollector but not into the undoped polysilicon. It is believed that the laser energy, in penetrating to the depth of the N+ material in the substrate 2 regions underneath pedestal collector region 4 and collector reach-through region 5, and in efficiently interacting with the N+ material rather than with either the undoped polycrystalline layer 6 or the lightly doped P− substrate 2, causes a selective epitaxial regrowth of the polycrystalline silicon 6 within regions 4 and 5. It is further believed that the selective epitaxial regrowth results from the localized melting of the polycrystalline silicon 6 within regions 4 and 5 and the subsequent cooling of regions 4 and 5 when the laser radiation is removed. Single crystal regrowth is limited substantially to those regions (4 and 5) which are in intimate contact with the single crystal subcollector 1.

Figure 5:
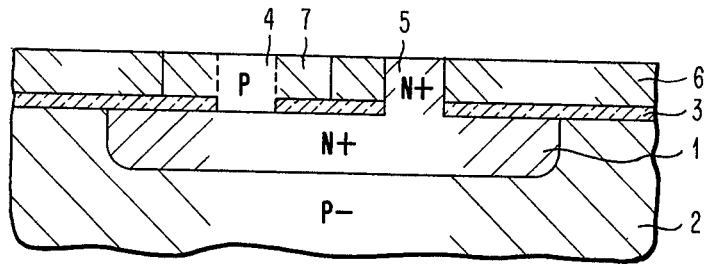
Figure 6:
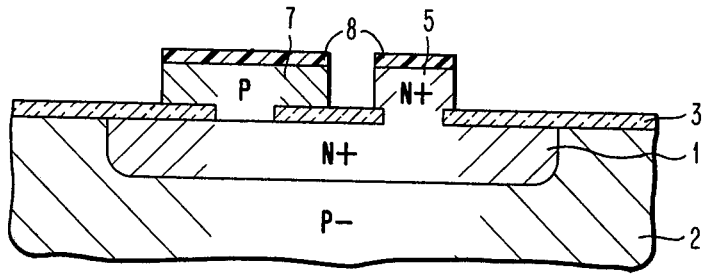

After the laser annealing step of FIG. 4 is completed, the layer 6 is masked to permit a P− type base formation by ion implantation or diffusion in region 7 surrounding and including region 4 and to permit an N+ type reach-through ion implantation or diffusion in region 5 as depicted in FIG. 5. When the implantations or diffusions are done, base region 7 and reach-through 5 are blocked out by a suitable mask 8 and the exposed polycrystalline silicon 6 is etched away in a conventional manner as shown in FIG. 6.

Figure 7:
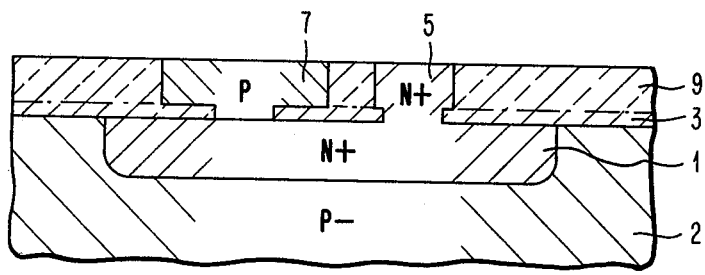

The block out mask 8 is removed and CVD oxide 9 is deposited and planarized in a manner similar to that previously described for the step of planarizing the polycrystalline silicon layer 6. Briefly, polyimide photoresist is spun over the CVD oxide 9. Using $CF_4$ reactive ion etching, the photoresist, and then the underlying CVD oxide, are etched away at substantially the same rate. The etching is continued until the planarized structure of FIG. 7 is produced with the top surfaces of the base region 7, the reach-through region 5 and the CVD oxide 9 being coplanar with respect to each other.

Figure 8:
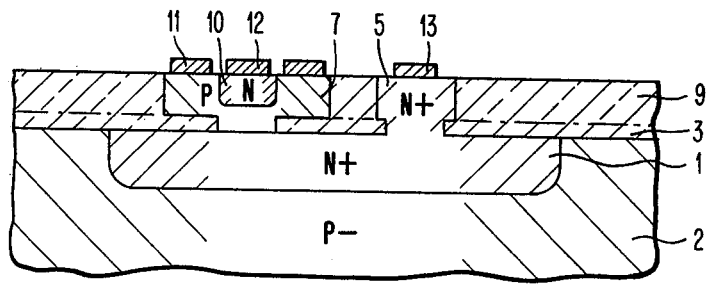

Finally, N+ emitter 10 is implanted or diffused and base, emitter and collector contacts 11, 12 and 13 are formed in a conventional manner to complete the transistor structure shown in FIG. 8. It should be noted that contact is made to the monocrystalline base region (directly above the pedestal collector region 4) via the polycrystalline base region of region 7 which surrounds the monocrystalline base region.

We claim:

1. The method comprising
providing a semiconductor substrate of a relatively low impurity concentration,
forming a region of relatively high impurity concentrantion in said substrate,
forming a masking layer on said substrate, said layer being apertured over a portion of said region
depositing polycrystalline silicon of a relatively low impurity concentration on said layer and said substrate, and
subjecting said polycrystalline silicon to laser radiation, the radiation from said laser interacting with said relatively high impurity concentration region in said substrate to melt and regrow said polycrystalline silicon selectively and thereby to convert said polycrystalline silicon substantially only over said portion of said region into epitaxial monocrystalline silicon.

2. The method described in claim 1 wherein said substrate and said region are of opposite type conductivities.

3. The method described in claim 2 wherein said substrate is P type having an impurity concentration in the range from intrinsic value to about $1 \times 10^{15}$ at/cc.

4. The method described in claim 3 wherein said region has an impurity concentration in the range from about $1 \times 10^{20}$ at/cc to about $1.5 \times 10^{21}$ at/cc.

5. The method described in claim 4 wherein said laser radiation has a wavelength of about 1.06 microns.

6. The method described in claim 1 wherein said masking layer is silicon dioxide.

7. The method described in claim 6 wherein said region is a subcollector and further including introducing base dopant into said epitaxial monocrystalline silicon.

8. The method described in claim 7 and further including introducing said base dopant into the polycrystaline silicon surrounding said epitaxial monocrystalline silicon.

9. The method described in claim 8 and further including introducing emitter dopant into the upper portion of said epitaxial monocrystalline silicon.

10. The method described in claim 9 and further including forming an emitter contact on said upper portion and a base contact on said polycrystalline silicon surrounding said epitaxial monocrystalline silicon.

11. The method described in claim 1 wherein said polycrystalline silicon is undoped.

* * * * *